United States Patent [19]
Kelly

[11] 3,978,471
[45] Aug. 31, 1976

[54] DIGITAL THERMOMETER USING A DUAL SLOPE A/D CONVERTER WITHOUT A HIGH PRECISION VOLTAGE SOURCE

[75] Inventor: Austin T. Kelly, Morristown, N.J.

[73] Assignee: Weston Instruments, Inc., Newark, N.J.

[22] Filed: Mar. 26, 1975

[21] Appl. No.: 562,194

[52] U.S. Cl. .................. 340/347 NT; 73/362 R; 324/104; 340/347 CC
[51] Int. Cl.² .................................. H03K 13/20
[58] Field of Search .......... 340/347 NT; 73/362 AR, 73/362 R, 1 F; 323/40, 75 H; 324/104, 99 D

[56] References Cited
UNITED STATES PATENTS

| | | | |
|---|---|---|---|
| 3,566,265 | 2/1971 | Reid | 340/347 NT |
| 3,566,397 | 2/1971 | Walton | 340/347 NT |
| 3,747,089 | 7/1973 | Sharples | 340/347 NT |
| 3,872,726 | 3/1975 | Kauffeld et al. | 73/362 AR |

OTHER PUBLICATIONS
Analog Devices, Inc., "Analog–Digital Conversion Handbook," June 1972, pp. 1-33,34.

*Primary Examiner*—Thomas J. Sloyan
*Attorney, Agent, or Firm*—William R. Sherman

[57] ABSTRACT

A measuring device such as a digital thermometer uses dual slope analog-to-digital converter techniques but elminates the usual need for a high precision voltage source. An input capacitor is connected through novel switching to the temperature responsive arm and the temperature insensitive arm of a resistance bridge, to the low precision voltage source and to the output of the integrator and detector amplifiers. The switching sequence is such that long term changes in the voltage source and in the amplifier offset and drift are cancelled out during measurement cycles, thereby providing highly accurate measurements without the usual need for an expensive high precision voltage source.

14 Claims, 2 Drawing Figures

DIGITAL THERMOMETER USING A DUAL SLOPE A/D CONVERTER WITHOUT A HIGH PRECISION VOLTAGE SOURCE

BACKGROUND OF THE INVENTION

The invention is in the field of measuring devices, such as for measuring temperature or other parameters. A specific embodiment of the invention relates to a digital thermometer.

Prior art devices of this type typically rely on a temperature responsive element incorporated in a bridge circuit connected to a high precision voltage source. The bridge imbalance due to the temperature responsive arm is converted to a digital number by a suitable analog-to-digital converter. One disadvantage with devices of this type is that their accuracy depends on that of a high precision voltage source, which makes such devices expensive to make and difficult to maintain.

This invention is directed to an improvement in such devices which eliminates the need for a high precision voltage source. In accordance with the invention, dual slope analog-to-digital converter techniques are used in a novel way which provides an accurate measure of temperature or similar parameters without using the previously indispensable high precision voltage source.

In a specific embodiment of the invention, the input capacitor, integrator and detector of the prior art analog-to-digital converter in an autozeroing configuration is combined with a resistance bridge having a temperature responsive arm and a temperature insensitive arm. The bridge is powered by a low precision voltage source. The free side of the input capacitor is connected to the temperature insensitive bridge arm through a first switch, to the temperature responsive bridge arm through a second switch, and to the voltage source through a third switch. The other side of the input capacitor, i.e., the side which is normally connected to the integrator input, is connected to the detector output through a fourth switch in the common autozeroing configuration. By opening and closing the four switches in a sequence which reflects the invented technique, the undesirable effects of long-term changes in the voltage source level and in the offset and drift of the integrator and detector amplifiers are eliminated, and the difference between the two arms of the bridge is measured accurately, thus obtaining an accurate measure of the effect of temperature on the temperature responsive bridge arm.

Specifically, only the second and fourth switches are initially in a closed state, to thereby place on the input capacitor an initial charge which reflects: (a) the voltage level of the voltage source, (b) the resistance of the temperature responsive bridge arm, and (c) the offset and drift of the integrator and detector amplifiers. Then, a dual slope measurement cycle is started comprising a fixed time interval and a variable time interval. During the fixed time interval, only the first switch is maintained in a closed state, all other switches being open, to thereby apply to the integrator a measurement voltage which reflects: (a) the initial charge on the input capacitor, (b) the voltage level of the voltage source, and (c) the resistance of the temperature insensitive bridge arm. During the variable time interval, only the third switch is maintained in a closed state, all other switches being open, to thereby apply to the integrator a reference voltage whose polarity is opposite that of the measurement voltage and whose magnitude reflects the voltage level of the voltage source. The variable time interval ends when the output of the integrator crosses the reference voltage. The duration of this variable time interval is a measure of the difference between the resistances of the two bridge arms, and is therefore a measure of the temperature of interest. If the levels of the voltage source and of the drift and offset of the integrator and detector amplifiers remain reasonably constant during the dual slope measurement cycle, the absolute values of these levels or changes in these levels as between successive measurement cycles have no effect on accuracy. Since each measurement cycle is of the order of milliseconds, it is unlikely that the level of the voltage source or the level of the drift and offset of the amplifiers would change during a measurement cycle. The longer term changes, as between measurement cycles, do not affect accuracy.

DETAILED DESCRIPTION

Figure 1:
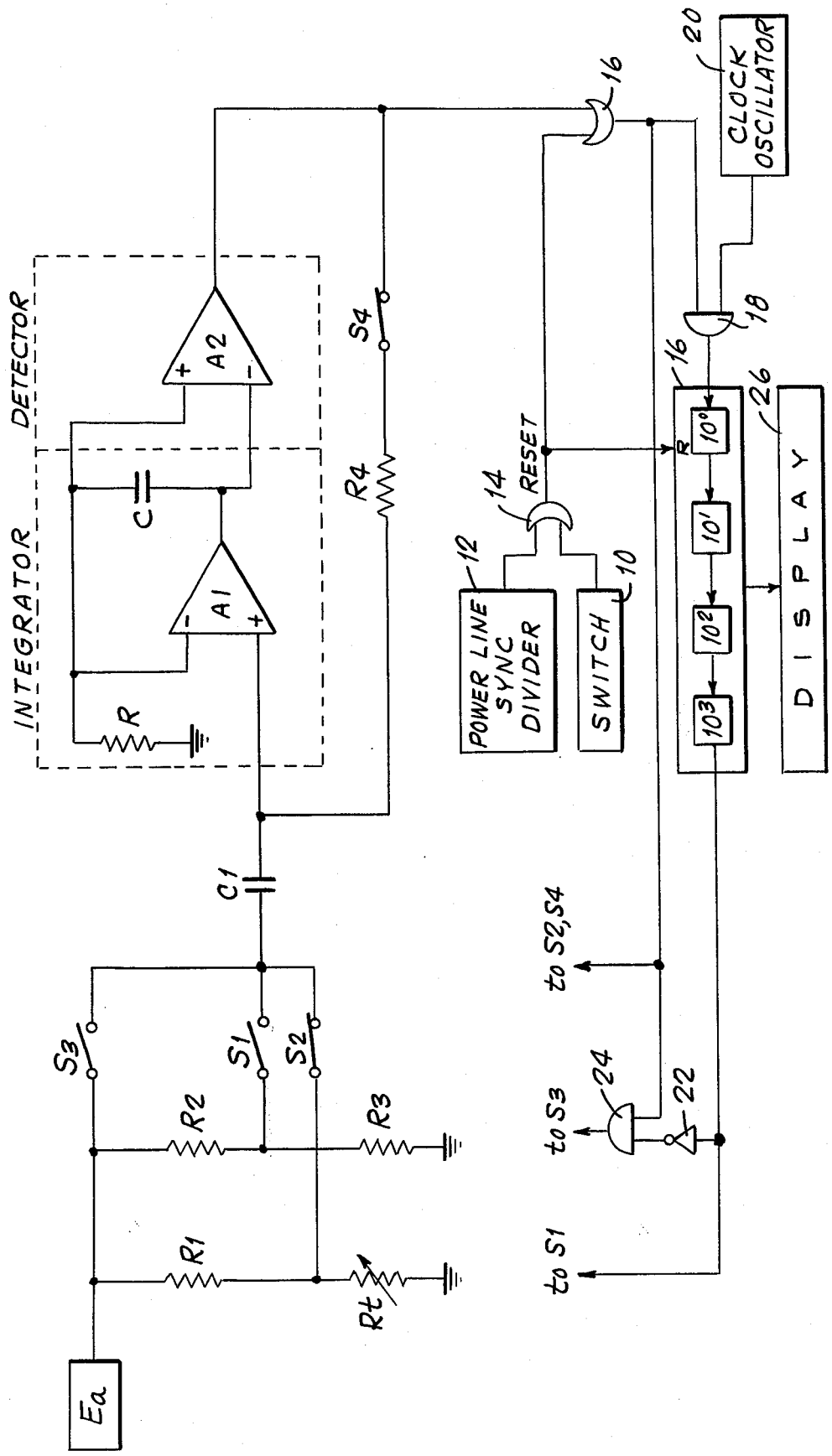
FIG. 1 is a schematic showing of a measuring device incorporating the invention.

The device shown in FIG. 1 includes an integrator, a detector and an input capacitor which are in the configuration of a prior art dual slope analog-to-digital converter having autozeroing. Specifically, the integrator comprises an integrator amplifier A1, an integrating capacitor C connected between the output of the integrating amplifier and its inverting input, and an integrating resistor R through which the inverting input of the integrator amplifier is grounded. The detector comprises a detector amplifier A2 whose inputs are connected across the integrating capacitor C, with the inverting input of the detector amplifier being connected to the side of the capacitor C which is connected to the output of the integrator amplifier. The right side of an input capacitor C1 is connected to the noninverting input of the integrator amplifier and is connected through a normally closed switch S4 to the output of the detector amplifier A2. The basic operating principles of such converters are discussed, for example, in Hoeschele, D.F., *Analog-to-Digital/Digital-to-Analog Conversion Techniques*, Whiley, 1968, pp. 381–384, and a converter of this type is the Digital Panel Meter 1230 made by Weston Instruments, Inc.

In accordance with the invention, the left side of the input capacitor C1 is connected to a resistance bridge and a low precision voltage source through suitable switches, and a control network is provided for opening and closing the switches so that long term changes in the voltage source level and in the amplifier drift and offset are eliminated.

The resistance bridge has a temperature responsive arm comprising the series combination of a fixed resistor R1 and a temperature responsive resistor Rt, and a temperature insensitive arm comprising the series combination of fixed resistors R2 and R3. The two bridge arms are connected between a low precision voltage source Ea and ground. The junction between the two resistors of the temperature insensitive arm is connected to the left side of the input capacitor C1 through a normally open switch S1, the junction between the two resistors of the temperature responsive arm is connected to the same left side of the input capacitor C1 through a normally closed switch S2, and the voltage source Ea is connected to the same left side of the input capacitor C1 through a normally open switch S3. The right side of the input capacitor C1 is connected to the output of the detector amplifier A2 through a normally closed switch S4.

In operation, switches S2 and S4 are in a closed state during an initial time interval, with switches S1 and S3 being open during this initial time interval, whereby the input capacitor C1 stores during this initial time interval an initial charge which is the difference between the voltage at the junction of the two resistors forming the temperature responsive bridge arm and the offset and drift of the integrator and detector amplifiers. More precisely, during this initial time interval the left side of the input capacitor C1 is brought to a voltage level equal to the voltage level of the source Ea as reduced by the voltage divider formed by the series combination of the resistors R1 and Tt, while the right side of the input capacitor is brought to a voltage representing the offset and drift of the amplifiers A1 and A2. The initial time interval is followed by a dual slope measurement cycle comprising a fixed time interval followed by a variable time interval.

At the start of the fixed time interval, switches S2 and S4 open and remain open through the end of the variable time interval. Switch S1, which was open during the initial time interval, closes at the start of the fixed time interval and remains closed through the end of the fixed time interval. Switch S3, which was open during the initial time interval, remains open through the end of the fixed time interval. Thus, during the fixed time interval, the integrator amplifier A1 receives a measurement voltage which is the difference between the voltage of the source Ea, as reduced by the voltage divider formed by resistors R2 and R3, and the initial charge on the input capacitor C1.

At the end of the fixed time interval and the start of the variable time interval, switch S1 opens and remains open through the end of the variable time interval, and switch S3 closes and remains closed through the end of the variable time interval. During the variable time interval, the integrator amplifier A1 receives a reference signal whose polarity is opposite that of the measurement signal and whose magnitude is the difference between the voltage level of the source Ea and the initial charge on the input capacitor C1. The variable time interval ends when the output of the integrator amplifier A1 crosses the level of this reference signal. The duration of the measurement cycle is short as compared to the duration of the initial time interval, so that the initial charge on the input capacitor C1 does not appreciable change during a single measurement cycle, but may change as between measurement cycles, to reflect long-term changes in the voltage level of the source Ea and in the level of the offset and drift of the amplifiers A1 and A2.

The control network necessary to open and close the switches at the appropriate times and the digital network necessary to measure the duration of the fixed and of the variable time intervals operates as follows. Prior to a dual slope measurement cycle, switches S2 and S4 are in their normal closed state, whereby the input capacitor C1 stores the initial charge discussed above. A dual slope measurement cycle starts in response to a reset pulse provided either by momentarily closing a suitably powered switch 10 or by suitably time-dividing the powerline frequency by a sync divider 12. The reset pulse, from either the switch 10 or the divider 12 is passed by an OR-gate 14 and is applied to the reset input of a four-stage decimal counter 16 to reset the counter to 9000. The same reset pulse from the OR-gate 14 is applied, through an OR-gate 17 to an AND-gate 18 to enable the gate 18 so that the clock pulses from a clock oscillator 20 are applied to the counter 16. Thus, at the start of the fixed time interval at time T1, the counter 16 starts counting up from the reset count of 9000. At the same time T1, the normally closed switches S2 and S4 are opened by the reset pulse at the output of OR-gate 17, while switch S1 is closed by the logical high signal at the decimal 9 output of the highest order stage in the counter 16. Until time T1 the two inputs of the detector amplifier A2 are at the same level and the output of the detector amplifier A2 is therefore at a logical low state. However, since switches S1, S2 and S4 change state at time T1, the output of the detector amplifier A2 changes at time T1 to a logical high state, thereby maintaining, through OR-gate 17, the open state of switches S2 and S4 even after the reset pulse has ended.

The fixed time interval ends 1000 clock pulses after time T1. At the 1000-th clock pulse from the oscillator 20, the decimal 9 output of the highest order stage in the counter 16 changes from logical high to logical low. This logical low signal returns switch S1 to its normally open state, and the inverse of it, as provided by an inverter 22 is and-ed with the output of OR-gate 17 (which at this time is high) by an AND-gate 24 whose high output closes switch S3. Thus, the variable time interval starts at time T2, and the counter 16 starts counting up from a zero count. The variable time interval ends when the integrating capacitor C discharges at time T3, thereby changing the output of the detector amplifier A2 from a logical high to a logical low. This change closes AND-gate 18, to thereby disconnect the clock oscillator 20 from the input of the counter 16, and the counter 16 stops at a count proportional to the duration of the variable time interval. This count can be displayed at a display 26 which is driven by a suitable driver-decoder network (not shown). The display 26 can be connected to the output of the OR-gate 17 through a suitable controller (not shown) so that the display 26 can be blanked out during the dual slope measurement cycle, so as to prevent flicker and to display only the steady state of the counter 16.

Figure 2:
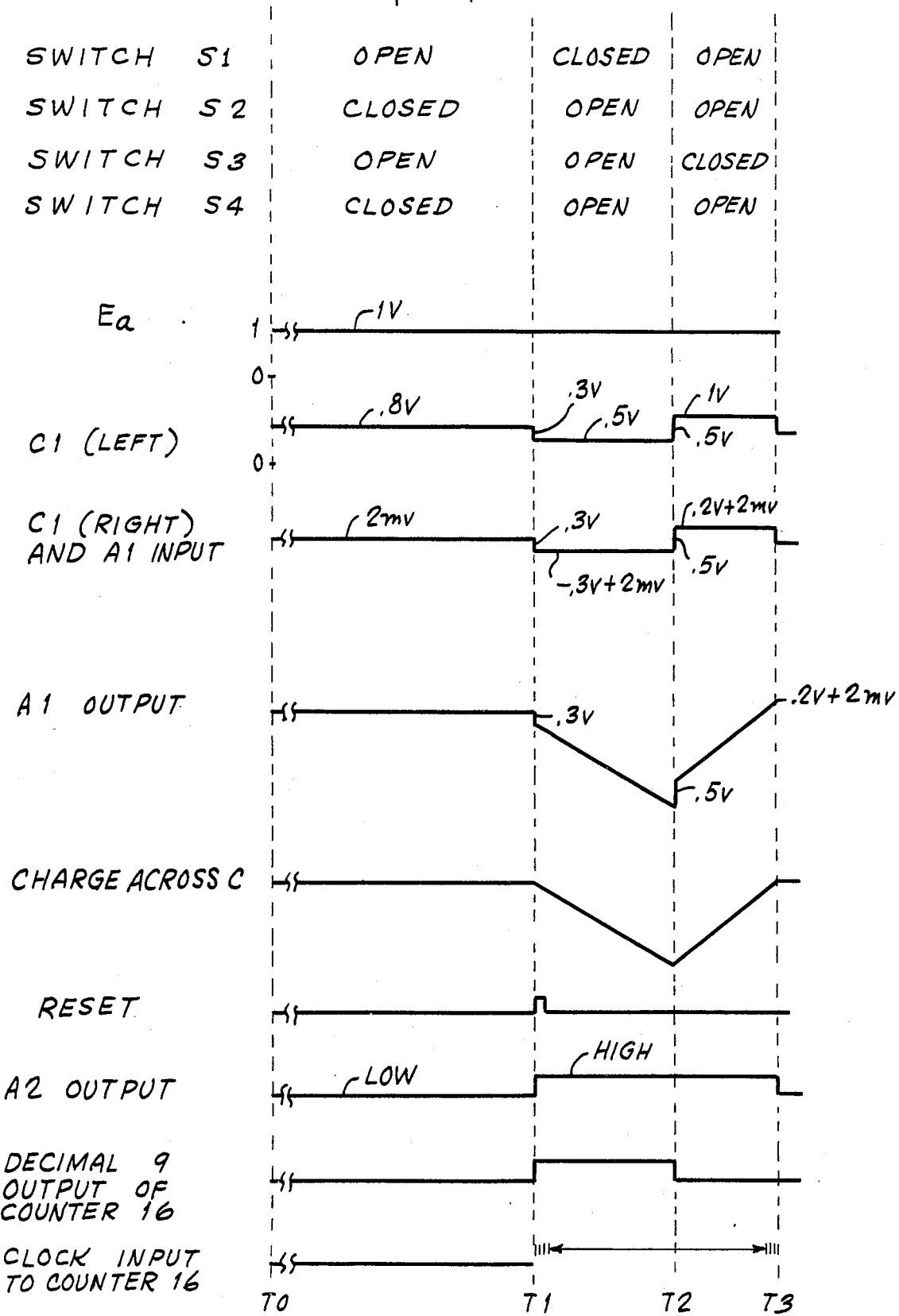
FIG. 2 is a timing chart of the voltage signals at certain points in the device shown in FIG. 1.

FIG. 2 illustrates the states of the switches and the voltage levels at certain points of the device shown in FIG. 2 prior to and during a dual slope measurement cycle. Assume as an example that the voltage level of the source Ea is 1 volt and the resistances of the two-bridge arms are such that the voltage at the junction between the two resistors of the temperature responsive bridge arm is 0.8 volts and the voltage at the junction between the two resistors of the temperature insensitive bridge arm is 0.5 volts. Assume further that the offset and drift of the amplifiers is 2 millivolts. During the initial time interval, from time T0 to time T1, only switches S2 and S4 are in their closed state, the potential at the left side of the input capacitor C1 is 0.8 volts. The potential at the right side of the input capacitor C1 is 2 millivolts and the charge across the capacitor is the difference between 0.8 volts and 2 millivolts. At time T1, when the fixed time interval starts, switches S2 and S4 change to an open state and switch S1 closes, whereby the potentials at each side of the input capacitor C1 go down by 0.3 volts, which is the difference between the voltage levels of the midpoints of the two-bridge arm. Since a negative measurement voltage is applied to the input of the integrator amplifier A1, the output of the integrator amplifier ramps down. At time T2, when the fixed time interval ends and the variable time interval begins, the input of the integrator amplifier A1 goes up by 0.5 volts, which is the difference between the voltage level of the source Ea and the voltage level at the junction between the two resistors of the temperature insensitive bridge arm. Since a positive reference voltage is now applied to the integrator amplifier A1, the output of the integrator amplifier ramps up until it crosses the level of the reference signal. At that time, the variable time interval ends, switches S2 and S4 close and switch S3 opens. Note that the output of the detector amplifier is at a logical low during the initial time interval, changes to a logical high at the start of the fixed time interval and remains at this logical high until the end of the variable time interval, when it returns to a logical low. The decimal 9 output of the highest order stage in the counter 16 is at a logical high during the fixed time interval, and at a logical low at all other times. The counter 16 receives clock pulses only from the start of the fixed time interval through the end of the variable time interval.

At the end of the variable time interval, the counter 16 has a count which represents only the difference between the resistances of the two bridge arms, provided that the voltage levels of the source Ea and of the offset and drift of the amplifiers A1 and A2 have remained constant during the measurement cycle. Since the measurement cycle is short (e.g. on the order of milliseconds) it is likely that these voltage levels would remain the same within a measurement cycle, although they may have long term changes, as between successive measurement cycles.

The relevant parameters of the resistance bridge may be selected to accommodate a particular situation. For example, the four resistors of the bridge may have the same values at a nominal temperature, whereby the departure from this nominal temperature would be the measured value. The magnitude and polarity of the measurement and reference voltages applied to the integrator amplifier may be different from those described above, and may be selected to accommodate any specific situation. For example, the relevant polarities may be reversed such that the integrator ramps up during the fixed time interval and ramps down during the variable time interval. It should be clear that the switches S1 through S4 should be fast acting switches, such as fast transistor switches, and that a succession of measurement cycles may be carried out by the divider 12 providing reset pulses at a selected interval, e.g. every half second, and that alternately measurement cycles may be initiated by an external control device (not shown) which applies a reset pulse to the OR-gate 14 in response to the occurrence of some external event.

I claim:

1. A measurement device comprising:
   an integrator amplifier and a detector amplifier each having an inverting and a non-inverting input and an output, an integrating capacitor connected between the output and the inverting input of the integrator amplifier, an integrating resistor connecting the inverting input of the integrator amplifier to ground, and means for connecting the inverting input of the detector amplifier to the output of the integrator amplifier and the noninverting input of the detector amplifier to the inverting input of the integrator amplifier, and an input capacitor having a right side connected to the noninverting input of the integrator amplifier;
   a voltage source and a resistance bridge connected across the source, said bridge having a temperature responsive arm providing an output voltage by dividing the source voltage in accordance with the temperature of a portion of the arm and a temperature insensitive arm providing an output voltage by dividing the source voltage in accordance with a fixed ratio;
   a first switch connecting the temperature insensitive bridge arm to the left side of the input capacitor to apply thereto the output voltage of the insensitive bridge arm when closed, a second switch connecting the temperature responsive arm to the left side of the input capacitor to apply thereto the output voltage of said temperature responsive arm when closed, a third switch connecting the source to the left side of the input capacitor to apply thereto the source voltage when closed, and a fourth switch connecting the right side of the input capacitor to the output of the detector amplifier to apply thereto the drift and offset of said amplifiers when closed;
   means for maintaining the second and fourth switches closed and the first and third switches open for an initial time interval of sufficient duration to place on the input capacitor an initial charge reflecting the difference between the output voltage of the temperature sensitive bridge arm and the offset and drift of the amplifiers;
   means for maintaining the first switch closed and the remaining switches open for a subsequent time interval of fixed duration which is short as compared to the initial time interval, to thereby apply to the integrator amplifier a measurement signal reflecting the difference between the output voltages of the two bridge arms; and
   means for maintaining the third switch closed and all other switches open for a subsequent variable time interval which ends when the two inputs of the detector amplifier are at the same level, to thereby apply to the integrator amplifier during the variable time interval a reference signal reflecting the difference between the voltage of the source and the output voltage of the temperature insensitive bridge arm, the duration of the variable time being short as compared to the initial time interval and being a function of the difference between the resistances of the two bridge arms, thus being a measure of the temperature affecting the temperature responsive arm.

2. A measurement device as in claim 1 including means for measuring the duration of the variable time interval and for providing an indication of the measured duration.

3. A measurement device as in claim 1 including means for carrying out successive cycles each comprising an initial, a fixed and a variable time interval.

4. A measurement device comprising:
   integrator means having an input and an output and responding to a voltage signal applied to the input to provide at the output a corresponding voltage ramp, detector means connected to the output of the integrator means for detecting when the ramp provided thereby crosses a defined threshold, and an input capacitor connected to the input of the integrator means;

a power source providing an output signal and an impedance bridge connected to the power source to receive the output signal therefrom, said bridge having a condition responsive arm providing an output signal by dividing the power source output signal in accordance with an ambient condition and a condition insensitive arm providing an output signal by dividing the power source output signal in accordance with a fixed ratio;

means for storing in the input capacitor an initial signal representing the output signal of the condition responsive bridge arm;

means for applying for a fixed time interval the output signal of the condition insensitive bridge arm to the input of the integrator means through said input capacitor to thereby apply to the input of the integrator means for said fixed time interval a measurement signal representing the combination of the output signal of the condition insensitive bridge arm and the initial signal stored in the input capacitor; and means for subsequently applying for a variable time interval the output signal of the power source to the input of the integrating means through the input capacitor to thereby apply to the input of the integrator means for said variable time interval a reference signal representing the combination of the power source output signal and the initial signal stored in the input capacitor, said variable time interval ending when the detecting means detects the crossing of a defined threshold by the integrator means output, and the duration of said variable time interval representing the difference between the output signals of the two bridge arms.

5. A measurement device as in claim 4 including means for providing a signal representing the offset and drift of the integrator and detector means and wherein the means for storing said initial signal in the input capacitor comprises means for storing an initial signal representing the combination of the output signal of the condition responsive arm and the signal representing the offset and drift of the integrator and detector means.

6. A measurement device as in claim 4 including means for measuring the duration of the variable time interval and for indicating the measured duration.

7. A measurement device as in claim 5 wherein the polarities of the measurement signal and of the reference signal are opposite each other.

8. A measurement device as in claim 5 wherein the condition responsive bridge arm is responsive to ambient temperature, the bridge is a resistance bridge and the power source is a voltage source.

9. A measurement device as in claim 8 wherein the initial signal is a charge representing the difference between the output signal of the temperature responsive bridge arm and the signal representing the offset and drift of the integrator and detector means, the measurement signal represents the difference between the output signal of the temperature insensitive bridge arm and the initial charge on the input capacitor, and the reference signal represents the voltage of the output signal of the voltage source.

10. A measurement method comprising:
providing an integrator which provides at its output a voltage ramp corresponding to an applied input voltage, a detector connected to the output of the integrator for detecting when the ramp crosses a defined threshold, an input capacitor connected to the integrator input, a power source providing an output signal, and an impedance bridge connected to the power source to receive the output signal therefrom, said bridge having a condition responsive arm providing an output signal by dividing the power source output signal in accordance with an ambient condition and a condition insensitive arm providing an output signal by dividing the power source output signal in accordance with a fixed ratio;

storing in the input capacitor an initial signal representing the combination of the output signal of the condition responsive bridge arm and a signal representing the offset and drift of the integrator and of the detector;

applying for a fixed time interval the output signal of the condition insensitive bridge arm to the input of the integrator through the input capacitor to thereby apply to the integrator input for said fixed time interval a measurement signal representing the combination of the output signal of the condition insensitive bridge arm and the initial signal stored in the input capacitor; and applying for a variable time interval the power source output signal to the integrator input through the input capacitor to thereby apply to the integrator input for said variable time interval a reference signal representing the combination of the power source output signal and the initial signal stored in the input capacitor, said variable time interval ending when the detector detects the crossing of said defined threshold by the integrator output and the duration of the variable time interval representing the difference between the output signals of the two bridge arms.

11. A method as in claim 10 wherein the condition responsive arm is responsive to ambient temperature, the bridge is a resistance bridge, the power source is a voltage source, the initial signal represents the difference between the output signal of the temperature responsive arm and the offset and drift of the integrator and detector, the measurement signal represents the difference between the output signal of the temperature insensitive bridge arm and the initial signal and the reference signal represents the difference between the voltage source output and the initial signal.

12. A method as in claim 11 including measuring the duration of the variable time interval and providing an indication of the measured duration.

13. A measurement device comprising:
integrator means having an input and an output and responding to a voltage signal applied to the input to provide at the output a corresponding voltage ramp, detector means connected to the output of the integrator means for detecting when the ramp provided thereby crosses a defined threshold, and an input capacitor connected to the input of the integrator means;

a power source providing an output signal and an impedance bridge connected to the power source to receive the output signal therefrom, said bridge having a condition sensitive arm providing an output signal by dividing the power source output signal in accordance with a sensed condition and a condition insensitive arm providing an output signal by dividing the power source output signal in accordance with the fixed ratio;

means for storing in the input capacitor an initial signal representing the output signal of one of the bridge arms;

means for applying, for a fixed time interval, one of the output signal of the other bridge arm and the output signal of the power source to the input of the integrator means through said input capacitor to thereby apply to the input of the integrator means for said fixed time interval a first signal representing the combination of one of the output signal of said other bridge arm and the output signal of the power source with the initial signal stored in the input capacitor; and means for subsequently applying, for a variable time interval, the other of the output signal of the other bridge arm and the output signal of the power source to the input of the integrating means through the input capacitor to thereby apply to the input of the integrator means for said variable time interval a second signal representing the combination of one of the output signal of the other bridge arm and the output signal of the power source with the initial signal stored in the input capacitor, said variable time interval ending when the detecting means detects the crossing of a defined threshold by the integrator means output, and the duration of said variable time interval representing the difference between the output signals of the two bridge arms.

14. A measurement method comprising:

providing an integrator which provides at its output a voltage ramp corresponding to an applied input voltage, a detector connected to the output of the integrator for detecting when the ramp crosses a defined threshold, an input capacitor connected to the integrator input, a power source providing an output signal, and an impedance bridge connected to the power source to receive the output signal therefrom, said bridge having a condition sensitive arm providing an output signal by dividing the power source output signal in accordance with a sensed condition and a condition insensitive arm providing an output signal by dividing the power source output signal in accordance with a fixed ratio;

storing in the input capacitor an initial signal representing the combination of the output signal of one of the bridge arms and a signal representing the offset and drift of the integrator and of the detector;

applying, for a fixed time interval, one of the output signal of the other bridge arm and the power source output signal to the input of the integrator through the input capacitor to thereby apply to the integrator input for said fixed time interval a first signal representing the combination of one of the output signal of the other bridge arm and the power source output signal with the initial signal stored in the input capacitor; and applying, for a variable time interval, the other of the output signal of the other bridge arm and the power source output signal to the integrator input through the input capacitor to thereby apply to the integrator input for said variable time interval a second signal representing the combination of said other of the output signal of the other bridge arm and the power source output signal with the initial signal stored in the input capacitor, said variable time interval ending when the detector detects the crossing of said defined threshold by the integrator output and the duration of the variable time interval representing the difference between the output signals of the two bridge arms.

* * * * *